United States Patent
Mori et al.

[11] Patent Number: 6,142,306
[45] Date of Patent: Nov. 7, 2000

[54] CARRIER BAND OF ELECTRONIC PARTS

[75] Inventors: Kazuhiro Mori, Katano; Eiji Itemadani, Sakai; Souhei Tanaka, Neyagawa; Osamu Hikita, Hirakata; Uzo Tomii, Nara; Kanji Sugio, Kyoto; Teruo Shoji, Ibaragi; Yukihiko Asao, Kasugai, all of Japan

[73] Assignee: Nissho Corporation, Osaka, Japan

[21] Appl. No.: 09/202,707
[22] PCT Filed: Mar. 20, 1998
[86] PCT No.: PCT/JP98/01212
  § 371 Date: Dec. 18, 1998
  § 102(e) Date: Dec. 18, 1998
[87] PCT Pub. No.: WO98/52845
  PCT Pub. Date: Nov. 26, 1998

[30] Foreign Application Priority Data

May 21, 1997 [JP] Japan ................................ 9-131355

[51] Int. Cl.⁷ .................................................. B65D 85/90
[52] U.S. Cl. ........................ 206/713; 206/714; 206/460
[58] Field of Search ................... 206/713, 714, 206/716, 722, 725, 460, 717

[56] References Cited

U.S. PATENT DOCUMENTS

| | | | |
|---|---|---|---|
| 4,411,362 | 10/1983 | Itemadani et al. | 206/716 |
| 5,119,934 | 6/1992 | Karasawa et al. | |
| 5,499,717 | 3/1996 | Hayashi | 206/714 X |
| 5,667,073 | 9/1997 | Okui | 206/713 |
| 5,765,692 | 6/1998 | Schenz | 206/713 |
| 5,964,353 | 10/1999 | Hamlin | 206/714 |

FOREIGN PATENT DOCUMENTS

| | | |
|---|---|---|
| 58-53899 | 3/1983 | Japan . |
| 61-119957 | 7/1986 | Japan . |
| 61-217363 | 9/1986 | Japan . |
| 2-109815 | 4/1990 | Japan . |
| 2-90268 | 7/1990 | Japan . |
| 4-102518 | 4/1992 | Japan . |
| 06-219412 | 8/1994 | Japan . |
| 9-323752 | 12/1997 | Japan . |
| WO97/18580 A1 | 5/1997 | WIPO . |

OTHER PUBLICATIONS

Japanese Patent Office, International Searching Authority, "International Search Report," (Jul. 14, 1998).

Japanese Patent Office, "Notice of Rejection Reasons" as to JP 09–323752, (Oct. 6, 1998).

*Primary Examiner*—Bryon P. Gehman

[57] ABSTRACT

A carrier band of electronic parts which can carry electronic parts such as IC packages in good protected condition without spoiling the convenience of a carrier tape having convexities and sticking tape. An electronic parts carrier band T which includes a flexible band (10) and keeps and carries longitudinally at intervals a large quantity of electronic parts (40) where each part (40) has a part body (42) and projecting portions (44) with the carrier band comprising: supporting stands (20), which are mounted longitudinally at intervals and project from the band (10); supporting faces (22), which are formed on the supporting stands (20) and support the electronic parts (40) by contacting the part body (42); opening portions (26), which are opened from the supporting faces (22) to a part of both side faces (24) of the supporting stands (20) at positions corresponding to the part bodies (42); and a sticking tape (30), which is longitudinally affixed to a back side of the band (10) including the supporting faces (22) by a one-sided sticking face (32) of the sticking tape (30), wherein a part of the sticking face (32) is exposed by the opening portions (26) and is stuck to a part body (42).

2 Claims, 8 Drawing Sheets

CARRIER BAND OF ELECTRONIC PARTS

TECHNICAL FIELD

The present invention relates to a carrier band of electronic parts, and more particularly, to a carrier band which is used to carry small electronic parts such as IC packages for transportation and deposit and the like and keeps many electronic parts together.

BACKGROUND ART

An IC package comprises a block-type body including a synthetic resin or ceramic in which an IC chip is enclosed and terminal pieces (leads, like many legs) projecting toward the surroundings of the body. Especially, in the IC package of the structure called "flat package", many terminal pieces horizontally project in lines from at least two sides of the body and the terminal pieces bend and their pointed ends are positioned below the bottom of the body.

A carrier tape is provided as a carrier means which can transport and deposit efficiently a large quantity of the IC packages and can easily treat the IC packages. The carrier tape comprises a tape including a synthetic resin which has sprocket holes in parallel in its side edges like a movie film. The IC packages are laid in storing dents emboss-formed in this carrier tape and the storing dents are covered by a covering film.

However, in the method of storing the IC packages in the storing dents of the carrier tape, a problem is that the IC packages or the terminal pieces collide against the inner side of the storing dents and the terminal pieces are apt to bend.

A technique to solve such a problem is disclosed in JP-A-06-219412. In this technique, convexities are formed on the carrier tape and a piercing hole is formed in the center of the convexity and a sticking face of the sticking tape affixed to the carrier tape from the back side of the convexities is exposed from the piercing holes and the IC packages mounted on the convexities are stuck and fixed on the sticking face. By mounting the IC packages on the convexities, the terminal pieces of the IC packages are prevented from touching the carrier tape and are therefore prevented from damage.

However, in the above carrier tape having the convexities and the sticking tape, there is a problem that keeping and fixing of the IC packages are apt to be insufficient.

As the convexities are formed inside the width of the carrier tape, the width of the convexities is fairly narrower than the width of the carrier tape. Because of how the convexities are formed, the upper face of the convexities is narrower than the lower face. The piercing hole opened on the upper face of the convexities becomes even more narrow. Therefore, the sticking face which is exposed from the piercing hole to stick and fix the IC packages becomes narrower and keeping and fixing of the IC packages become insufficient.

Also, a part of the sticking tape must be formed to project from the back side of the piercing hole to the same height position as the upper face of the convexities of the surface to make the sticking face contact the lower face of the IC packages. For that, it is necessary to bend the sticking tape from the back side to the face side at the inner edge of the piercing hole. As for sticking tape made of paper and the like, though it is comparatively easy to bend longitudinally in one direction, that is to say, two-dimensionally, it is difficult to bend three-dimensionally in both directions of length and width. Therefore, it is necessary to make the width of the sticking tape narrower than the width of the piercing hole and to bend the sticking tape only in a direction of length in order to make the bending of above-mentioned sticking tape easy. As a result, the width of the sticking face becomes further narrower than the width of the piercing hole.

Furthermore, as another problem, there is a problem that the sticking tape affixed to the back of the carrier tape is apt to meander.

At the back of the carrier tape, the sticking tape is arranged along an uneven figure formed at the back of the convexities and is thrust out from the back of the carrier tape to the plane of the face of the piercing hole. Therefore, the sticking tape can not be stuck exactly as being stuck to an even face and is apt to meander. When the sticking tape meanders and is not arranged exactly in the center of the width of the piercing hole, the size of the sticking face exposed from the piercing hole is reduced and the side edge of the sticking tape is caught by the inner edge of the piercing hole and the sticking tape can not be thrust up to the face side of the piercing hole. As a result, the IC packages can not be sufficiently stuck and fixed.

Now, except for the IC package, there are many electronic parts having structure portions which are weak and apt to be damaged, such as a microscopic portion projecting from the part body. Such electronic parts have the above-mentioned problems.

DISCLOSURE OF THE INVENTION

OBJECTS OF THE INVENTION

An object of the present invention is to provide a carrier band of electronic parts which can carry electronic parts such as IC packages in good protected condition without spoiling the convenience of the above-mentioned carrier tape using the convexities and the sticking tape.

SUMMARY OF THE INVENTION

To solve the above problems, the invention according to claim 1 is a carrier band of electronic parts which includes a flexible band and keeps and carries longitudinally at intervals a large quantity of electronic parts where each electronic part has a part body and projecting portions projected from the part body, with the carrier band comprising:

supporting stands, which are mounted longitudinally at intervals and project from the band;

supporting faces, which are formed on the supporting stands and support the electronic parts by contacting the part body;

opening portions, which are opened from the supporting faces of the supporting stands to a part of both side faces of the supporting stands in a width direction of the band; and a sticking tape, which is longitudinally affixed to a back side of the band including the supporting faces by a one-sided sticking face of the sticking tape, wherein parts of the sticking face are exposed by the opening portions and stuck to the part bodies.

These and other objects and the advantages of the present invention will be more fully apparent from the following detailed disclosure.

DETAILED DESCRIPTION OF THE INVENTION

Respective elements are concretely explained below.

[Electronic Parts]

As for electronic parts, among semiconductor apparatuses such as IC packages of various structures called QPF, J-lead article, TSOP and the like, sensor apparatus and other electronic parts, the present invention is applied to electronic parts which have around the part body projecting portions which may be easily damaged projecting structures such as terminal pieces. The projecting portions are made of material such as metal, synthetic resin, glass and ceramics and have weak shapes or structures which are easily damaged by impact or by friction contact. And, their arrangement and shapes are not restricted. In many cases, the projecting portions thrust from the side of the part body toward the outside. However, there are cases that the projecting portions thrust from the upper face of the part body or that the projecting portions thrust from a part of the lower face of the part body. The material and the figure of the part body are not especially restricted. However, the part body preferably has such an outside figure that can be supported steadily by the below-mentioned supporting face such as a rectangular parallelepiped.

[Band]

The material for the band is the same as the tape material which is used for conventional carrier tape as long as the material has enough flexibility to be able to be treated at the time of carrying. The material is preferably fit for the formation of the supporting stands and the processing of the opening portions. Concretely speaking, a film material or a sheet material made of synthetic resin, ceramics or paper and the like is used in one or many layers.

The width of the band is established a little larger than the external form of the carried electronic parts. To use the same band for at least two kinds of electronic parts, the width should be established according to the electronic parts of the maximum size. In some of the existing carrier tape treating apparatuses, the width of the carrier tape is standardized. Therefore, by adapting the width of the carrier tape to such standards, the carrier tape becomes usable in the existing carrier tape treating apparatuses.

Carrying means can be formed in the band such as sprocket holes which are used to make the carrier band travel mechanically. As the carrying means, employed are mechanical structures or usual travelling band-type material, such as holes, slits, notches and projections. The carrying means are usually formed in both side edges of the band where storage of the electronic parts is not disturbed. However, the carrying means may be formed in one side edge of the band. The carrying means may be formed in the center of the band, if storage of the electronic parts is not disturbed.

[Supporting Stands]

The supporting stands are mounted longitudinally at intervals on the band. The intervals are preferably sufficiently long so that the electronic parts do not mutually interfere with each other when the electronic parts are kept on respective supporting stands.

As for the shapes of the supporting stands, the supporting stands preferably have shapes and measurements so that the supporting stands can support stably the electronic parts. The shape of the supporting stands may be different from the plane figure of the electronic parts and the area of the supporting stands may be narrower than the area of the electronic parts. A part of the supporting stands may be arranged outside the external form of the part body of the electronic parts. In this case, the supporting stands should be arranged so that the projecting portions of the electronic parts do not touch the supporting stands. As the concrete shapes of the supporting stands, pyramids of which a section is a polygon such as a rectangle, a circle or an ellipse, can be employed.

The height of the supporting stands is established so that the projecting portions of the stored electronic parts do not touch the surface of the band around the supporting stands and become elevated. However, if the supporting stands are too high, the storage of the electronic parts becomes unstable and too bulky and the manufacturing labor increases. Concretely speaking, the height of the supporting stands should be established from 0.5 mm to several mm.

Usually, one supporting stand is matched with one electronic part. However, one electronic part can be supported by at least two electronic parts.

In order to correspond one supporting stand to at least two kinds of electronic parts of which measurements and figures are different, the figure of the supporting stand should be established so that the projecting portions of the electronic parts do not touch the supporting stand or the surface of the band if any electronic parts of the minimum measurement or the maximum measurement are to be stored.

[Supporting Face]

Usually, the supporting face is the highest face of the supporting stand. Upper face portions other than the highest face of the supporting stand can be made as the supporting face. The shape and length of the supporting faces are established so that the supporting faces contact the bottoms of the electronic parts and can support stably the electronic parts. The shapes of the supporting stands may be similar to the shapes of the bottoms of the electronic parts. As the shapes of the supporting stands, shapes such as a rectangle and a circle can be employed.

[Opening Portions]

The opening portions are formed by piercing the band. A part of the opening portions is arranged on the supporting face and at least a division of the part of the opening portions is arranged at a position corresponding to a part body of an electronic part. A part of the opening portions may be arranged on the supporting stands other than the supporting faces or on the surface of the band. A part of the opening portions may be arranged at a position separated from the external area of a part body.

The size of the opening portions is established so that the sticking tape has sufficient area to keep and fix the electronic parts. The sticking tape is arranged to be exposed from the opening portions. If the width of the opening portions in the width direction of the band is established to be wider than the width of the sticking tape, when the sticking tape is pushed up from the back side of the opening portions and bent and the sticking faces are arranged at the same height position of the supporting faces in the opening portions, then the sticking tape is not caught by a side edge of the sticking tape and the arrangement of the sticking face is not disturbed.

In the case where the opening portions are arranged from the supporting faces of the supporting stands to a part of both sides of the supporting stands in the width direction of the band, even if the width of the sticking tape is as wide as the total width of the supporting faces, both side edges of the sticking tape are prevented from catching on the side edge of the opening portions. Conversely speaking, even in the case of the supporting stands or the band being of comparatively narrow width, the sufficiently wide opening portions which are not caught by both side edges of the sticking tape, can be formed and sticking faces of wide area can be exposed to the opening portions.

In the case where the opening portions are arranged to both side faces of the supporting stands, the shape or the size of the opening portions are not especially limited as long as the arrangement of the above-mentioned sticking tape is not prevented.

When the opening portions are arranged on the supporting faces, a substantial area of the supporting faces decreases.

Therefore, it is preferable that the size of the opening portions is established so that a sufficient area of the supporting faces for supporting the electronic parts is maintained.

At least two opening portions can be arranged on one supporting stand or on one supporting face. By keeping one electronic part on the sticking faces exposed from the at least two opening portions, the electronic part is kept stably. Also, if one large opening portion is formed, the strength of the supporting stand is apt to become weak and the support for the sticking tape arranged in the opening portion is apt to become unstable. However, by dividing the same area into at least two opening portions, the strength of the supporting stand is sufficiently maintained and the sticking tape is steadily supported.

[Sticking Tape]

The sticking tape is affixed to the part body and fixes the part body in place by being arranged to expose to a position wherein a part of the one-sided sticking face is stuck to the part body of the electronic part at the opening portions. Accordingly, it is preferable that the sticking faces of the sticking tape are arranged at a sticking position to the part bodies, that is to say, the same height position as the upper face of the supporting faces.

As for the material of the sticking tape, the usual tape materials such as paper, synthetic resin or a metal leaf are used. A soft material which can be steadily stuck along the uneven shape of the supporting stands in the back of the band, is preferable.

As for the adhesive making up the sticking faces, the usual adhesives employed generally to stick and fix various articles are used. The various adhesives prepared according to the sticking characteristics of the electronic parts can be used. For example, when the part bodies of the electronic parts are made of silicon resin, silicon-based adhesives are preferable. Preferably, the sticking force of the sticking face is so that the sticking tape can be affixed to the band and so that the electronic parts can be kept temporarily and so that the electronic parts are neither soiled nor are unduly influenced at the time of peeling off.

As for the width of the sticking tape, it is necessary that the width is sufficient so that the electronic parts can be stuck and kept steadily by the section exposed to the opening portions. When the width of the sticking tape is a little narrower than the width of the opening portions, the operation of bending the sticking tape and arranging the sticking face at the same height position as the supporting face is easy. If the width of the sticking tape is as wide as the inner width of the back side of the supporting face, the side portion of the supporting stands arranged at both sides of above-mentioned inner width operates as a guide which prevents meandering of the sticking tape at the time of affixing the sticking tape.

[Protecting Convexities]

The protecting convexities are arranged as needed around the supporting stands on the surface of the band. The protecting convexities are made of the same material as the band such as synthetic resin and paper. The protecting convexities can be emboss-formed at the same time that the supporting stands are formed on the band. Protecting convexities manufactured by different material from the band may be joined to the band.

As to the protecting convexities, shapes are employed such as a pillar shape such as a column, a prism and a pyramid, wall shape which form a straight line or a curve and an uneven figure along the external form of the electronic parts.

The achievable function of the protecting convexities is different according to their arrangement and figure.

For example, the protecting convexities, which are arranged at positions of the same height as the supporting stands and corresponding to the part bodies of the electronic parts, can keep stably the electronic parts by cooperating with the supporting stands. The linear protecting convexities can protect the electronic parts consequently by increasing the rigidity or hardness of the band in the direction of bending the protecting convexities. The protecting convexities, which are arranged higher than the electronic parts kept by the supporting stands, can protect the electronic parts as barriers surrounding the electronic parts. There are occasions that the protecting convexities of one kind perform at least two functions of the above-mentioned functions.

BRIEF DESCRIPTION OF THE DRAWINGS

In FIGS. 1–11, the following part numbers may be noted: 10—band, 12—sprocket hole, 20—supporting stand, 22—supporting face, 24—side face, 26—opening portion, 30—sticking tape, 32—sticking face, 40—IC package, 42—part body, 44—terminal piece, 62–68—protecting convexity.

BEST MODE FOR CARRYING OUT THE INVENTION

First Embodiment

The first embodiment shown in FIGS. 1–4 is a carrier band used to carry QFP-type IC packages.

[Structure of Carrier Band]

Figure 1:
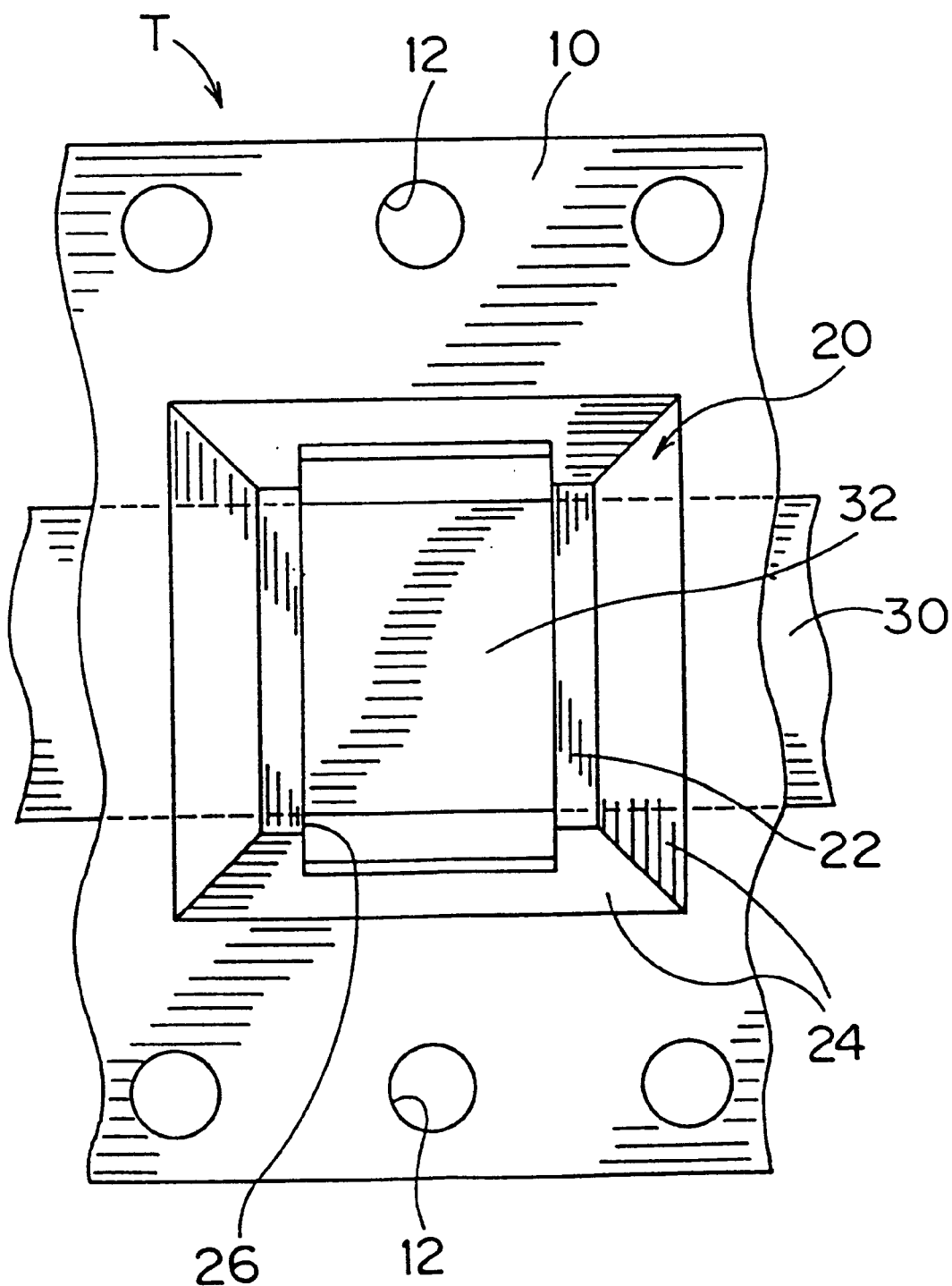
FIG. 1 is a top view of an embodiment according to the present invention.
Figure 2:
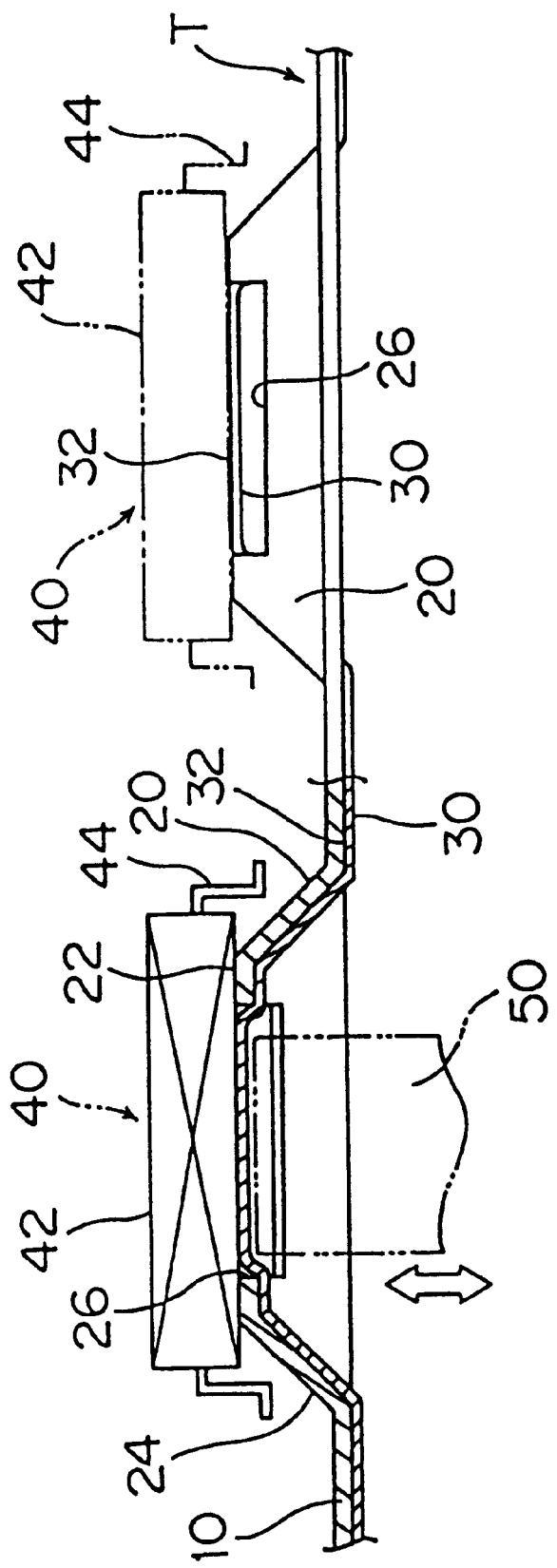
FIG. 2 is a partial sectional side view of FIG. 1.
Figure 3:
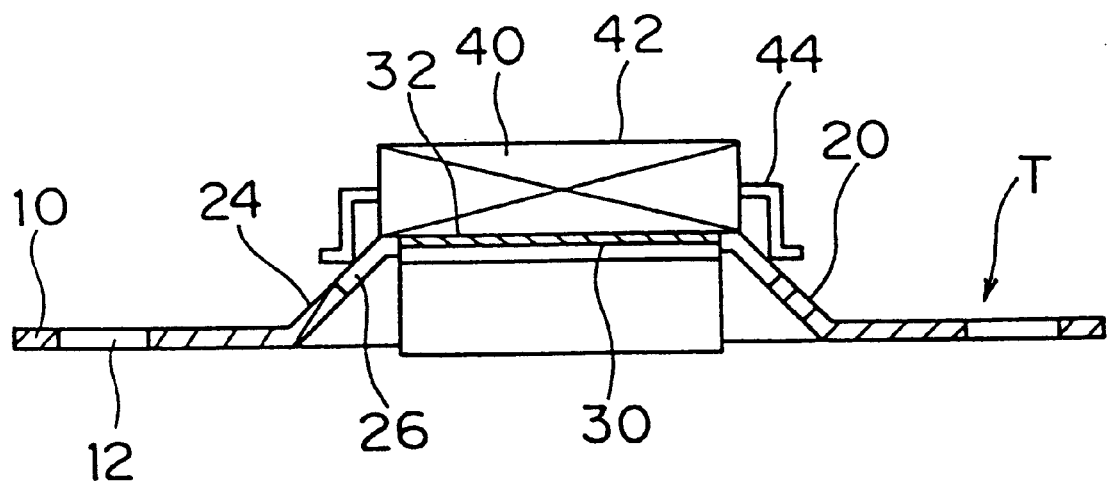
FIG. 3 is a sectional view in a perpendicular direction of FIG. 2.

As shown in FIGS. 1–3, the carrier band T includes a band 10 made of synthetic resin and a sticking tape 30 affixed to the back of the band 10. In the sticking tape 30, a silicon-based adhesive is applied to one side of a thin paper.

Supporting stands 20 formed as square pyramids are mounted longitudinally at regular intervals on the surface of the band 10. The supporting stands 20 are made by emboss-forming the band 10. The supporting stands 20 include square-type supporting faces 22 arranged at the upper edges of the supporting stands 20, and side faces 24 arranged with inclination around the supporting faces 22.

Rectangular opening portions 26 penetrating the band 10 are arranged from the center of the supporting faces 22 to the middle of the side faces 24, 24 arranged in the width direction of the band 10. As a result, the supporting faces 22 are arranged in opposed strips divided into two parts in the length direction of the band with the opening portions 26 therebetween.

Many circular sprocket holes 12 penetrating the band 10 are arranged at regular intervals on both side edges of the band and are used to make the carrier band T travel successively.

The sticking tape 30 is affixed to the back of the band 10 along a center line. The sticking tape 30 has a sticking face 32 applied as adhesive on the contacting side with the band 10. The sticking tape 30 is affixed along the uneven shape of the back of the supporting stands 20. The sticking face 32 of the sticking tape 30 is exposed to the opening portions 26 and is arranged at the nearly same height position as the supporting faces 22. Therefore, as shown in FIG. 2, the sticking tape 30 is bent perpendicularly at the back side of the supporting stands 20 from the back of the supporting faces 22 along the inner edges of the opening portions 26 and, furthermore, the sticking tape 30 is bent horizontally from the inner upper edges of the opening portions 26 and the sticking face is arranged at the same face with the upper face of the supporting faces 22.

The width of the sticking tape 30 is established nearly as wide as or a little narrower than the width of the supporting faces 22. Therefore, the sticking face 32 is exposed at the opening portions 26 extending nearly all the width of the supporting faces 22. The sticking tape 30 and the sticking face 32 are not arranged at positions corresponding to the side faces 24, 24, of the opening portions 26 where there are slits.

[Mounting Operation of IC Packages]

As shown in FIG. 2, while the carrier band T including the band 10 and the sticking tape 30 travels to the fixed direction by a carrying apparatus of which illustration is omitted, IC packages 40 provided from a different carrying apparatus are mounted on the upper side of the supporting stands 20.

The IC package 40 has a flat rectangular parallelepiped shape and includes a part body 42 in which an IC chip is enclosed and terminal pieces 44 as many projections projecting horizontally from the four side faces of the part body 42. The terminal pieces project horizontally from the part body 42 and their tips bend downward and their pointed ends bend again horizontally. The pointed ends of the terminal pieces 44 are positioned below the bottom of the part body 42.

The center of the bottom of the IC packages 40 is arranged to contact the supporting faces 22 of the supporting stands 10. As a result, the bottom of the IC packages 40 makes contact with and sticks to the sticking face 32 of the sticking tape 30 which is exposed to the opening portions 26.

At this time, the IC packages 40 can be stuck to the sticking face 32 steadily and strongly by pushing the IC packages 40 to the sticking face 32 with a back pusher 50 such as gum which has a elasticity. Still, the back pusher 50 is advanced to the inner upper portion of the supporting stands 20 only while the IC packages 40 are stuck to the sticking face 32, and the back pusher 50 is returned to the lower portion of the traveling carrier tape T when the sticking operation is finished.

In the IC packages 40 arranged on the supporting stands 20, as the length of the IC packages is established longer than the length of the supporting faces 22 of the supporting stands 20 in the length direction of the band 10, the terminal pieces 44 projecting toward the surroundings are in the condition of being at a higher altitude than the surface of the band 10 at the side faces 24 of the supporting stands 20. As shown in FIG. 3, as the width of the IC packages 40 is as wide as the width of the supporting faces 22 in the width direction of the band 10, the terminal pieces 44 are arranged at positions by the side faces 24 of the supporting stands 20. However as the opening portions 26 are arranged at the side faces 24 in this portion, the terminal pieces 44 are arranged in the space of the opening portions 26 and do not touch the band 10.

In this way, the carrier band T keeping the IC packages is used for transportation and deposit and the like in the condition of a long film, in the condition of being cut off at regular lengths and bent or in the condition of being rolled up in a vortex. The band 10 cannot be bent much in the section wherein the supporting stands 20 are formed. However, the band 10 can be bent to some extent as a usual carrier tape in the section between the neighboring supporting stands 20. Therefore, the above-mentioned step of rolling up the band in a vortex can be done easily. If portions of the carrier band T overlap each other, the bottom of the band 10 touches only the upper face of the IC packages 40 and the terminal pieces 44 do not touch directly the overlapped band 10.

As is shown from the above explanation, in the carrier band T of the above embodiment, as long as the part bodies 42 can be mounted on the supporting stands 20 in the condition of permitting the terminal pieces 44 of the IC packages 44 to remain free, the shape and size of the IC packages 40 are not especially limited. Accordingly, one kind of the carrier band T can be used combinationally to carry at least two kinds of the IC packages 40 or other electronic parts.

[Taking Out Operation of IC Packages]

Figure 4:
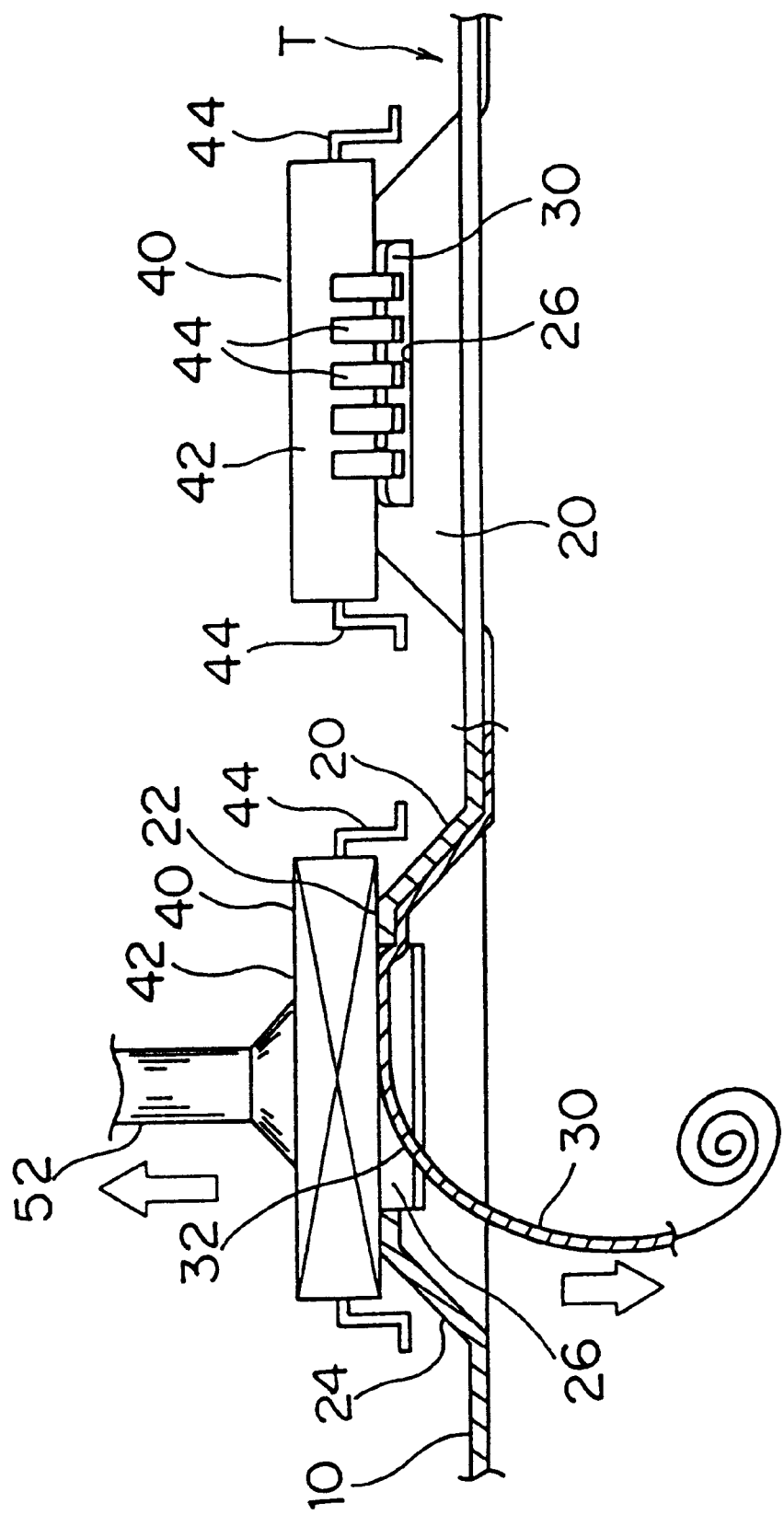
FIG. 4 is a partial sectional side view showing operation.

As shown in FIG. 4, the carrier band T travels in the fixed direction in the same manner as the mounting operation and the sticking tape 30 is rolled up from one end and is peeled off from the back of the band 10. At the same time, a vacuum absorbing pad 52 is put to the upper face of the IC packages 40 and the IC packages 40 are drawn off and raised upward. As a result, the IC packages 40 are peeled off from the sticking face 32 and taken out from the carrier band T.

The IC packages 40 can be peeled off from the sticking tape 30 and taken out by drawing off the IC packages 40 with the vacuum absorbing pad without peeling off the sticking tape 30 from the band 10. Also, it is possible to take out the IC packages 40 by thrusting up a needle-shaped element from the back side of the sticking tape 30 and thrusting out the IC packages 40 with the needle-shaped element penetrating the sticking tape 30. However, in the case of the IC packages 40 which are thin and structurally weak, the above method of peeling off the sticking tape 30 from the band is preferable because the burden applied to the IC packages is decreased. Still, the terminal pieces 44 of the IC packages do not touch other things when they are taken out.

The band 10 (after the IC packages 40 are taken out and after being peeled off the sticking tape 30) can be used again as the carrier band T by affixing the sticking tape again. If the sticking tape 30 is not peeled off from the band 10 and remains affixed, the carrier band T including the sticking tape 30 as well as the band 10 can be used again. However, in this case, care should be taken that the sticking force of the sticking face 32 has not decreased.

Second Embodiment

Figure 5:
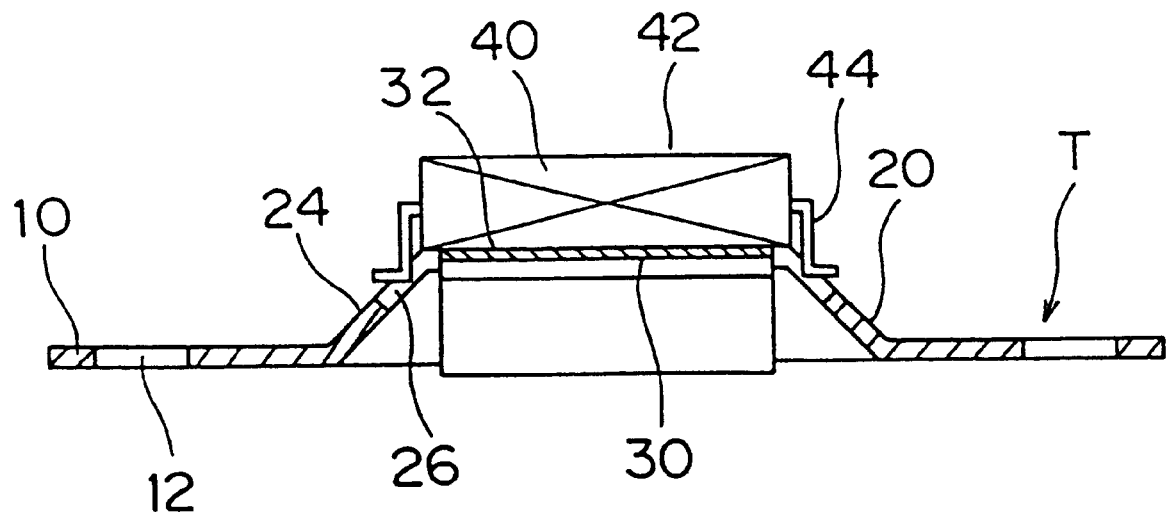
FIG. 5 is a sectional view of a second embodiment.

In the second embodiment shown in FIG. 5, the carrier band T which is fundamentally the same as the above-mentioned first embodiment, is used.

However, the terminal pieces 44 of the IC packages 40 project downward at positions which are close to the part body 42. In IC packages like this, if the terminal pieces 44 are arranged in space by the section of the opening portions 26 which is arranged at the side faces 24 of the supporting stands 20, the terminal pieces 44 are prevented from touching the carrier band T and are therefore prevented from damage.

In an embodiment like this, it is preferable that the opening portions 26 extend to a comparatively wide area of the side faces 24.

Third Embodiment

Figure 6:
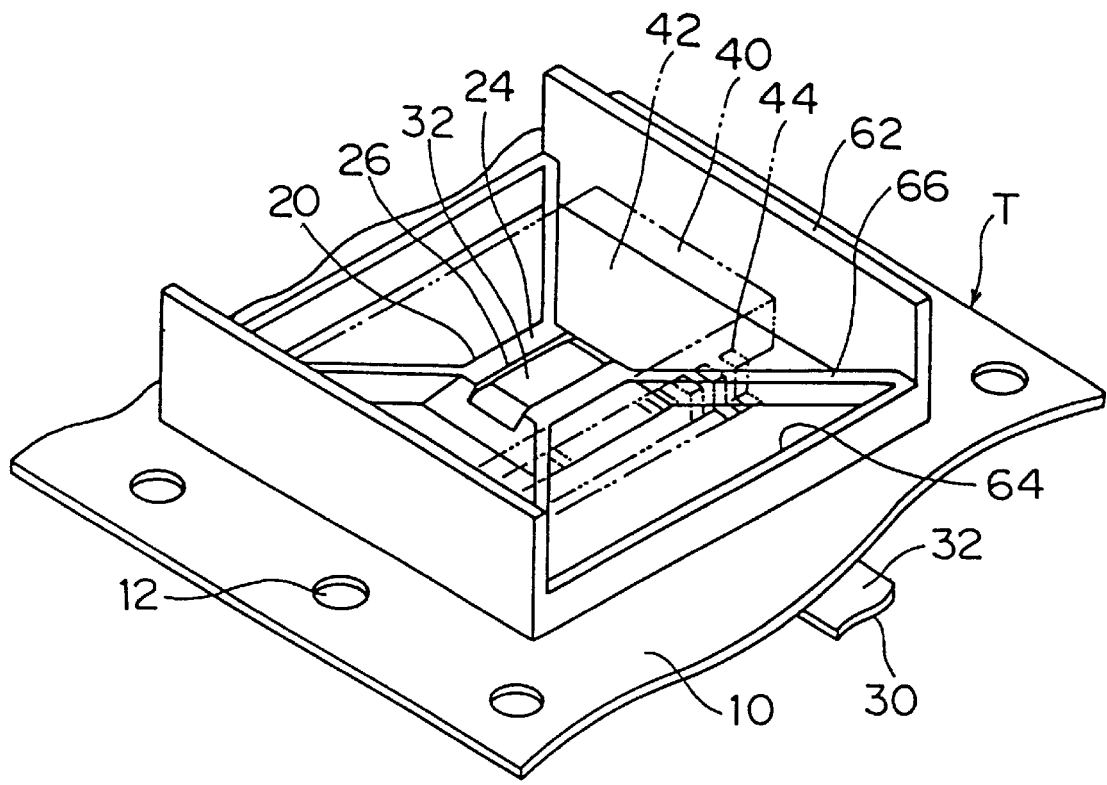
FIG. 6 is a perspective view of a third embodiment.
Figure 7:
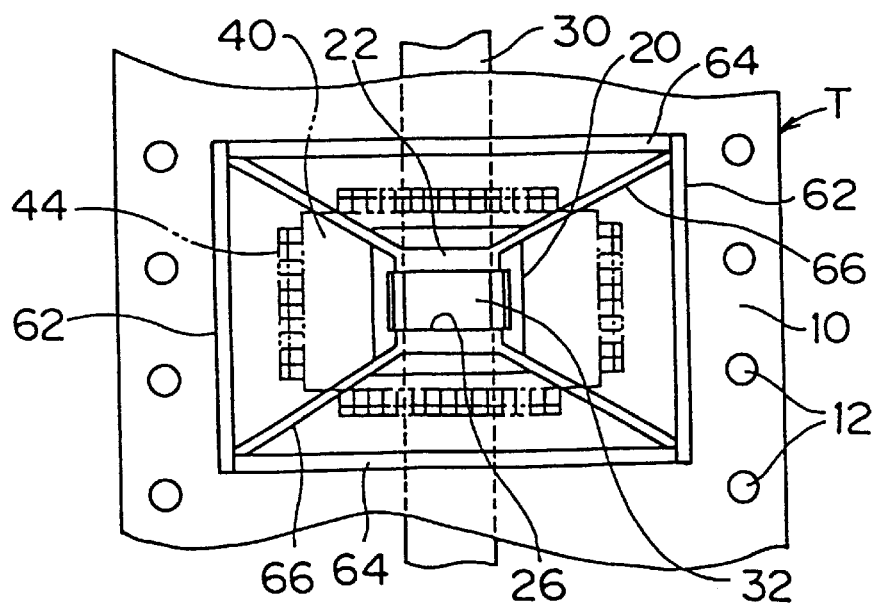
FIG. 7 is a top view of FIG. 6.

In the third embodiment shown in FIG. 6 and FIG. 7, protecting convexities are formed.

The structure of the band 10, supporting stands 20 and the sticking tape 30 are the same as the above-mentioned embodiment.

As shown in FIG. 7, frame-shaped protecting convexities 62, 64 are formed in a simple rectangular shape surrounding the outside of the IC packages 40 kept by the supporting stands 20, and diagonal-shaped protecting convexities 66 which link the four corners of the frame-shaped protecting convexities 62, 64 and four corners of the supporting stands 20, are further formed.

As shown in FIG. 6, the diagonal-shaped protecting convexities 66 are established at the same height as the supporting stands 20 and their upper faces are at the same height as the supporting faces 22 of the supporting stands 20. The diagonal-shaped protecting convexities radiate outwardly. Among frame-shaped protecting convexities 62, 64, a pair of the protecting convexities 64, 64 arranged in the length direction of the band 10 is established at the same height as the supporting faces 20 or the diagonal-shaped protecting convexities 66. A pair of the protecting convexities arranged in the width direction of the band 10 is established at a higher position than the upper edges of the IC packages 40 kept by the supporting stands 20.

These protecting convexities 62-66 are manufactured by emboss-forming the band 10 in the same manner as the supporting stands 20.

When the IC packages 40 are mounted on the carrier band T which has the above-mentioned structure, the bottoms of the part bodies 42 of the IC packages 40 are supported by the supporting stands 20 and a part of the diagonal-shaped protecting convexities 66. This enables a more stable retention than a keeping only by the supporting stands 20. As shown in FIG. 7, as the diagonal-shaped protecting convexities 66 are arranged diagonally without touching the terminal pieces 44 of the IC packages 44, there is no occasion that the terminal pieces 44 are touched and damaged.

As the diagonal-shaped protecting convexities 66 and the frame-shaped protecting convexities 62, 64 increase the rigidity and hardness of the whole band 10, the band 10 is prevented from bending and touching the terminal pieces 44.

By making the protecting convexities 62 higher than the IC packages 40, the touching of other objects upon the IC packages can be prevented. When the carrier bands T are overlapped, the protecting convexities 62 can prevent another carrier band T from touching the IC packages 40 and causing problems.

In the embodiment shown in the figures, three kinds of the protecting convexities are combined: the diagonal-shaped protecting convexities 66, and the high and low frame-shaped protecting convexities 62, 64. However, if only one kind or two kinds of the protecting convexities are formed, the function of each protecting convexity is maintained.

Fourth Embodiment

Figure 8:
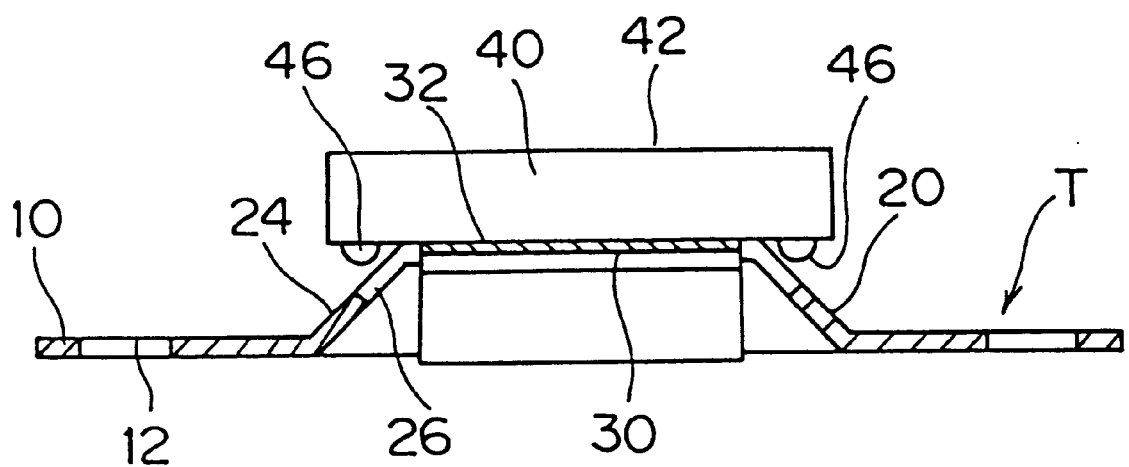
FIG. 8 is a sectional view of a fourth embodiment.

The fourth embodiment shown in FIG. 8 is a case where the ball-grid-type IC packages 40 are carried.

Hemisphere-shaped connecting terminals 46 are arranged in the vicinity of the lower faces of the IC packages 40. Even in the case of the IC packages 40 like this which have protruding structure on the lower faces, if the IC package 40 has a flat plane in the center of the lower face to which the sticking tape 30 can be stuck and if the supporting stand 20 can stably support the IC package 40, the IC packages 40 can be retained.

Fifth Embodiment

Figure 9:
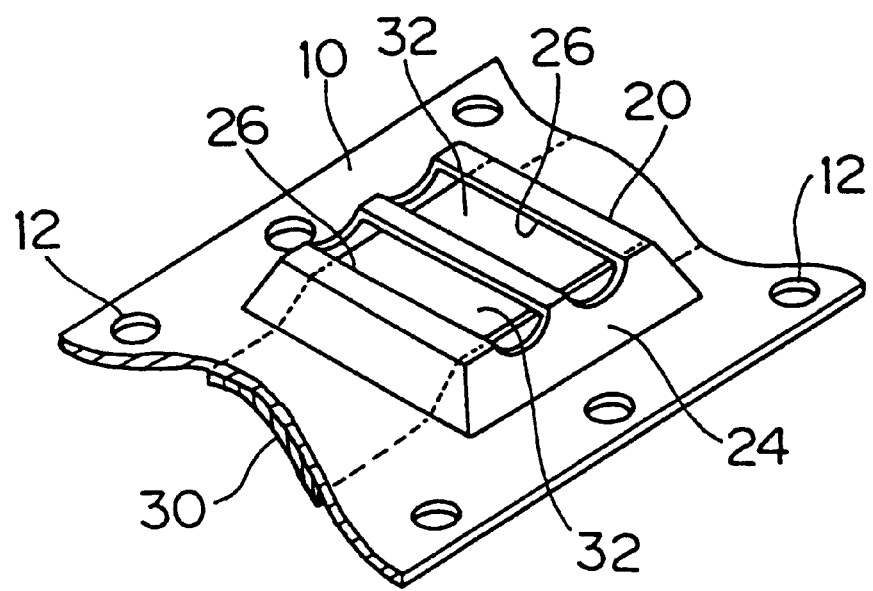
FIG. 9 is a perspective view of a fifth embodiment.

In the fifth embodiment shown in FIG. 9, the opening portions 26 are arranged at the at least two positions of the supporting face 22. The opening portions 26 are in a row along the length direction of the band 10. The sections of the opening portions 26 arranged at the side faces of the supporting stand 20 have arc side edge shapes.

In the above-mentioned embodiment, the opening parts of the supporting face 22 are small in comparison with the case wherein the large opening portions are made up by the sum of the front and rear opening portions 26. Furthermore, as the structure corresponding to a reinforcing beam is arranged between the front and rear opening portions 26, 26, the strength of the supporting stand 20 increases. As the sticking tape 30 is affixed to the back of the supporting stands 22 in the middle section of the front and rear opening portions 26, 26, the sticking tape 30 is steadily supported.

Sixth Embodiment

Figure 10:
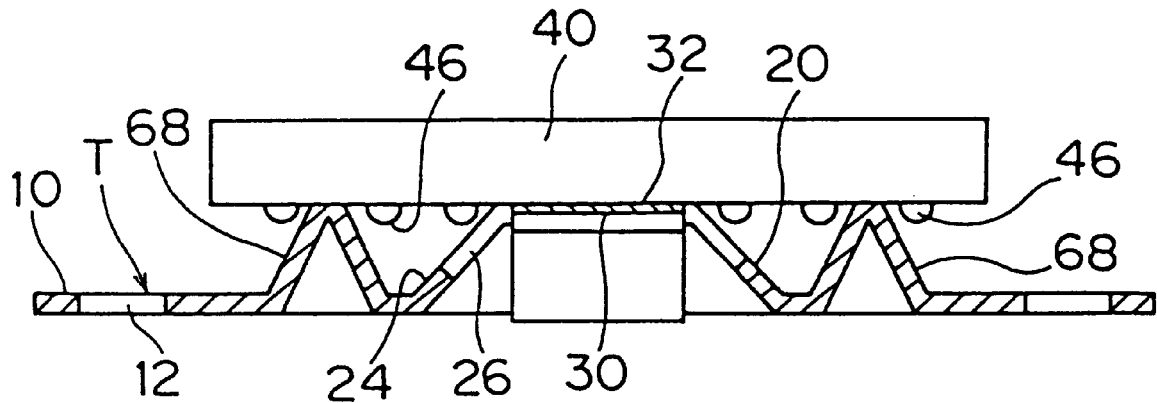
FIG. 10 is a sectional view of sixth embodiment.
Figure 11:
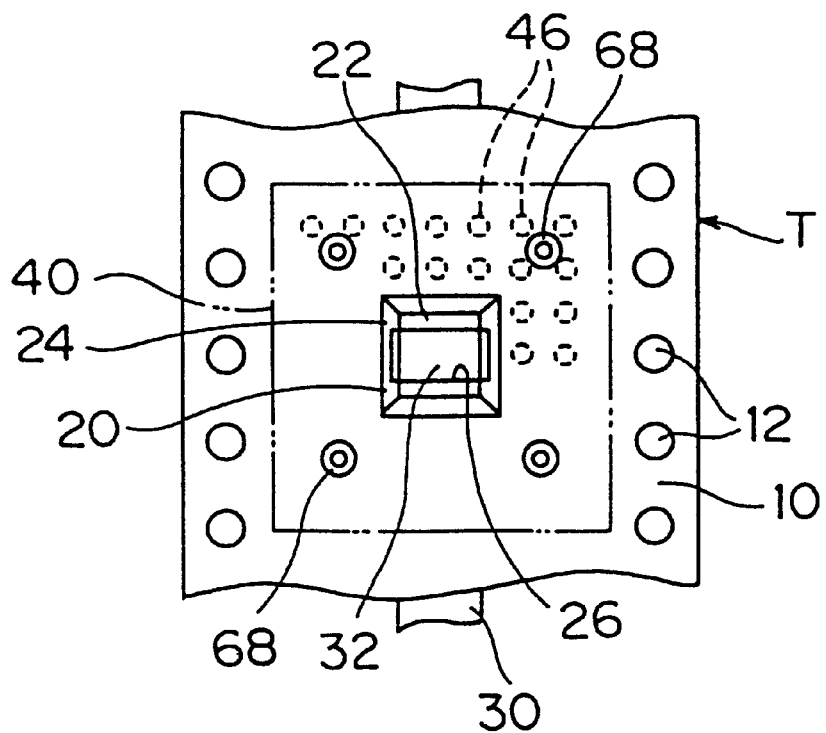
FIG. 11 is a top view of FIG. 10.

The sixth embodiment shown in FIGS. 10 and 11 is applied as the above-mentioned embodiment shown in FIG. 9 to the ball-grid-type IC packages 40 which have protruding structure on the lower faces. As the fundamental structure is the same as the above-mentioned embodiment shown in FIG. 9, different points are mainly stated.

The IC packages 40 have many connecting terminals 46 from the inside to the vicinity of the lower faces. Therefore, if only the center section where connecting terminals 46 are not arranged is supported by the supporting stands 20, supporting of surrounding section becomes unstable.

Then, cone-shaped protecting convexities 68 whose upper edges are flat are arranged in the area outside of the supporting stands 20 where the connecting terminals 46 of the IC packages 40 are not arranged. The height of the protecting convexities is established as nearly the same as the height of the supporting stands 20 or the height of the sticking face 32.

As shown in FIG. 11, the protecting convexities 68 are arranged diagonally at four positions of the supporting stand 20 or the IC package 40. The protecting convexities 68 are manufactured by emboss-forming at the same time as the forming of the supporting stands 20.

The IC packages 40 do not touch the connecting terminals 46 and their whole lower faces can be stably supported by the supporting stands 20 in the center and the protecting convexities 68 arranged around the supporting stands 20.

The cone-shaped protecting convexities 68 of the above-mentioned embodiment can be used instead of the diagonal-shaped protecting convexities 66 in the embodiment of FIGS. 6 and 7.

Other Embodiment

The shape and size of the section arranged on the side faces 24 of the supporting stands 20, of the opening portions 26, are not restricted to the above-mentioned embodiments and can be modified variously.

For example, in above-mentioned embodiment of FIG. 1, opening portions 26 having a rectangular section are employed. However, the front and rear edges of the opening portions 26 may be inclined at the section of the side faces 24 and the width of the front and rear edges of the opening portions 26 may be narrow.

If the area occupied by the opening portions 26 in the height direction of the side faces 24 is increased, the terminal pieces 44 can be stored as in the above-mentioned embodiment of FIG. 5. However, the opening portions 26 may be arranged only close to the upper edges of the side faces 24 as long as the terminal pieces 44 are not caught by the sticking tape 30 arranged almost on the whole of the supporting faces 22.

INDUSTRIAL APPLICATION

According to the carrier band of electronic parts of the present invention, the opening portions of the supporting stands are opened from the supporting faces of the supporting stands to a part of the both side faces of the supporting stands in a width direction of the band. Therefore, if a wide sticking tape extending to the whole width of the supporting faces is used, it is difficult for the side edge of the sticking tape to be caught by the inner side edge of the opening portions and it is easy to perform the operations of pushing up the sticking tape exposed to the opening portions to the same face as the supporting face and arranging the sticking tape. As a result, electronic parts can be retained satisfactorily by sticking the wide sticking face steadily to the electronic parts and a miniaturization of the carrier band and a reduction of the material cost can be achieved and a retention function of the electronic parts is improved.

What is claimed is:

1. A carrier band of electronic parts which includes a flexible band and keeps and carries longitudinally at intervals a large quantity of electronic parts, with each of the electronic parts comprising a part body and projecting portions projecting from the part body and with the flexible band comprising a base portion, a back side, and longitudinal and lateral directions, with the carrier band comprising:

a) supporting stands, which are mounted longitudinally relative to the flexible band at intervals on the flexible band and project from the base portion of the flexible band in a first direction;

b) wherein each of the supporting stands comprises a supporting portion comprising a supporting face for supporting a respective electronic part by confronting the part body, wherein each of the supporting stands further comprises a back face opposite of the supporting face, and wherein each of the supporting stands further comprises a pair of laterally spaced apart side portions and a pair of longitudinally spaced apart side portions, with each of the side portions comprising an inner side face and an outer side face, with each of the side portions being disposed between the supporting face of the supporting portion and the base portion of the flexible band, and with the laterally spaced apart side portions being disposed across from each other in the lateral direction of the flexible band and the longitudinally spaced apart side portions being disposed across from each other in the longitudinal direction of the flexible band;

c) wherein each of the supporting stands still further comprises an open portion, with the open portion being disposed in the supporting portion and leading into a part of each of the laterally spaced apart side portions so as to open said part of the laterally spaced apart side portion;

d) a sticking tape having a longitudinal and lateral direction and being affixed to the back side of the flexible band and the back face of the supporting portion of the supporting stand, with the sticking tape comprising a sticking face, with a part of the sticking face being exposed by the open portion to stick to the part body; and e) wherein each of the inner side faces of the laterally spaced apart side portions extend obliquely away from the base portion and inwardly towards each other and wherein each of the inner side faces of the longitudinally spaced apart side portions extend obliquely away from the base portion and inwardly towards each other, and wherein each of the outer side faces of the laterally spaced apart side portions extend obliquely away from the base portion and inwardly towards each other and wherein each of the outer side faces of the longitudinally spaced apart side portions extend obliquely away from the base portion and inwardly towards each other such that the supporting stand as a whole tapers as it extends away from the base portion.

2. A carrier band of electronic parts according to claim 1, wherein each of the supporting portions comprises a set of open portions.

* * * * *